(12) United States Patent
Kobayashi

(10) Patent No.: US 7,228,523 B2
(45) Date of Patent: Jun. 5, 2007

(54) METHOD OF AUTOMATICALLY CORRECTING MASK PATTERN DATA AND PROGRAM FOR THE SAME

(75) Inventor: Yoshikazu Kobayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 248 days.

(21) Appl. No.: 11/037,227

(22) Filed: Jan. 19, 2005

(65) Prior Publication Data

US 2005/0160393 A1 Jul. 21, 2005

(30) Foreign Application Priority Data

Jan. 20, 2004 (JP) ............................. 2004-011555

(51) Int. Cl.
*G06F 17/50* (2006.01)
(52) U.S. Cl. .......................................... 716/21; 716/19
(58) Field of Classification Search ................. 716/21, 716/19
See application file for complete search history.

(56) References Cited

U.S. PATENT DOCUMENTS

2005/0044522 A1* 2/2005 Maeda ....................... 716/18

2005/0076320 A1* 4/2005 Maeda ....................... 716/10

FOREIGN PATENT DOCUMENTS

JP 6-318643 11/1994

* cited by examiner

*Primary Examiner*—Sun James Lin
(74) *Attorney, Agent, or Firm*—Foley & Lardner LLP

(57) ABSTRACT

A method of automatically correcting mask pattern data includes steps (a) to (d). Here, in this method, the mask pattern data are for producing photo masks used in manufacturing processes of a semiconductor integrated circuit where cells including dummy cells are placed on a semiconductor chip. The step (a) is a process of merging tentatively an assistant mask layer into one of main mask layers. Each of the main mask layers corresponds to one of the photo masks. The assistant mask layer includes first regions, each of which corresponds to one of the dummy cells. The step (b) is a process of checking whether or not the one of main mask layers and the merged assistant mask layer agree with a design rule. The step (c) is a process of replacing the one of main mask layers with another of the main mask layers, into which the assistant mask layer is merged, when a violation against the design rule is found in the step (b). The step (d) is a process of converting the assistant mask layer into the merged one of main mask layers. The merged one of main mask layers does not have a violation against the design rule.

24 Claims, 7 Drawing Sheets

METHOD OF AUTOMATICALLY CORRECTING MASK PATTERN DATA AND PROGRAM FOR THE SAME

BACKGROUND OF THE INVENTION

1. Field of the Invention

The present invention relates to a method of automatically correcting mask pattern data. More particularly, the present invention relates to a method of automatically correcting mask pattern data used in manufacturing a photo mask for a semiconductor integrated circuit.

2. Description of the Related Art

In recent years, a semiconductor integrated circuit, such as a large scale integrated circuit (LSI), a very large scale integrated circuit (VLSI) and an ultra large scale integrated circuit (ULSI) has been highly integrated and densified. The semiconductor integrated circuit has been able to be composed of a million or more transistors in association with the advancement of a higher integration and a higher density. The semiconductor integrated circuit is exemplified as a system LSI. In the system LSI, a system including a central processing units (CPU), memories (ROM, RAM), buffers, a plurality of peripheral devices to carry out various signal processes connected to each other through buses and signal lines, is assembled in one semiconductor chip.

In such a system LSI, as the circuit scale thereof is large, it is impossible to carry out a circuit design directly at a transistor level. Thus, a system design, a function design, a detailed logical design, a circuit design, a layout design and a mask manufacture need to be sequentially executed.

In the system design, CPU, ROM, RAM, a buffer and a plurality of peripheral devices are assumed to be one function block, respectively. The entire operation and configuration of the system are determined so as to obtain the desirable functions. In the function design, the relations among the respective functions and the operations inside the respective function blocks are determined based on the specification determined in the system design. In the detailed logic design, the layout of macro cells to configure the respective function blocks is placed on an IC chip. Here, inner operations of the function blocks are determined by the function design. Then, macro cells are mutually interconnected (placement and routing).

The macro cell is composed of basic logic components and basic logic circuits. The basic logic component is exemplified as a NAND gate and a NOR gate. The basic logic circuit is exemplified as a latch, a counter and a memory which are configured by combining the plurality of above-mentioned basic logic components. In the macro cell, each of the functions is described by using a programming language such as a hardware description language (HDL). The macro cells are registered in a library.

In the layout design, the placement and routing of the cells corresponding to the various basic logic circuits are carried out based on a net list indicating the connection relation among the logic circuits. Then, mask pattern data are manufactured to produce a photo mask. Here, the standard cells and the already-designed modules registered in the library are placed on the chip. Dummy cells are placed in gaps (spaces) between the respective cells so as to embed in the gaps.

The dummy cells are placed, for example, in order to embed in the gaps and consequently control the density of the data, drop the processing amount, improve the yield and insert a capacitance between a power supply and a ground.

Here, the mask pattern data are prepared to produce the many photo masks. Respective mask layers are formed as those mask pattern data. Rectangular regions corresponding to the respective cells and dummy cells are placed in the mask layer. The rectangular regions correspond to open regions of the photo mask.

GFIG. 1 is a view showing a conventional example of the mask pattern data. Assuming that the low Vt transistors (HPTr (High Performance Transistor)) and high Vt transistors (MPTr (Middle Performance Transistor)) are mounted on a substrate. In the HPTr, an ion dose of the ion implantation is relatively low to make a gate threshold voltage (Vt) lower. In MPTr, an ion dose of the ion implantation is relatively high to make the gate threshold voltage (Vt) higher. In this case, two mask layers are used in preparing the mask pattern data for the channel ion implantation of the transistor. One is an ion implantation mask layer (HPTr implantation layer) for forming the low Vt transistor (HPTr) and another is an ion implantation mask layer (MPTr implantation layer) for forming the high Vt transistor (MPTr). Each of two mask layers includes the mask layer for N-channel ion implantation and the mask layer for P-channel ion implantation. As shown in FIG. 1, an N-channel HPTr implantation layer 101, a P-channel HPTr implantation layer 102, an N-channel MPTr implantation layer 103 and a P-channel MPTr implantation layer 104 are used.

Here, in each of the N-channel HPTr implantation layer 101, the P-channel HPTr implantation layer 102, the N-channel MPTr implantation layer 103 and the P-channel MPTr implantation layer 104, a large number of rectangular regions are placed. The rectangular regions correspond to the open regions of the photo masks for forming the cells and dummy cells.

Also, the rectangular regions of each of the implantation layers include rectangular regions 101p and 102p corresponding to the open regions of the photo masks for forming the cells and dummy cells.

Next, while the routing between the cells is carried out, the mask pattern data (artwork data) as the layout design result is verified.

Here, when a design rule check is carried out, in particular, in a multi Vt process, there may be a case that the width of the dummy cell is smaller than the minimum value of the design standard. Thus, a large number of dummy cells are placed which may be possibly judged as a design rule violation. Here, in the multi Vt process, a plurality of kinds of channel ion implantation is carried out in order to form a plurality of kinds of transistors. Each of the plurality of kinds of transistors corresponds to one of a plurality of kinds of the gate threshold voltages (Vt).

That is, the dummy cell is placed based on the outer shape of the cell. Thus, if the design rule violation occurs because the data of the cell includes the data that does not satisfy the design rule, there may be possibly the case that an automatic placement and routing tool cannot solving the violation.

For this reason, a mask layer synthesizing process performs a resizing process on a cell adjacent to the dummy cell which is judged as the design standard violation. In the resizing process, a reducing figure process is carried out after an enlarging figure process. This causes that the dummy cell is absorbed to the adjacent cell. As a result, the design standard violation can be solved.

For example, as shown in FIG. 1, when the rectangular region of the N-channel MPTr implantation layer 103 is placed adjacently to the rectangular region 101p, the resizing process is performed on this rectangular region. The rectangular region 101p is absorbed to this rectangular region.

This situation is shown in FIG. 2. FIG. 2 is a view showing a conventional example of the mask pattern data. As shown in FIG. 2, this is referred to as a new rectangular region 103b.

Also, as shown in FIG. 1, when the rectangular region of the P-channel MPTr implantation layer 104 is placed adjacently to the rectangular region 102p, the resizing process is performed on this rectangular region. The rectangular region 102p is absorbed to this rectangular region. As shown in FIG. 2, this is referred to as a new rectangular region 104b.

However, this resizing process results in a problem that this requires an enormous processing time and a data storing capacity.

Also, the above-mentioned conventional technique, there may be the case of the residual of the design rule violation which cannot be solved by the resizing process. In this case, the manual modification of the artwork is required at the stage of the mask formation. Therefore, the enormous amount of the modification must be carried out as well as the waste of time and labor occurs on the designing work.

FIG. 3 is a view showing a conventional example of the mask pattern data. As shown in FIG. 3, the residual design rule violation occurs in the case that the rectangular region 101p and the rectangular region 102p are in point contact with each other at a corner (the portion B). Also, as shown in FIG. 2, the residual design rule violation occurs in the case that the rectangular region 101 and the other rectangular region 101 are in point contact with each other at a corner (the portion A) In these cases, during the resizing process, the rectangular regions may return to the original states or the originally necessary portion may be removed. This also causes that the manual modification must be inevitably required.

In conjunction with the above description, Japanese Laid Open Patent Application (JP-A-Heisei 6-318643) discloses a method of resizing process for LSI layout pattern data. In the method of resizing process for LSI layout pattern data, firstly, the resizing process is classified into two cases. One is the case that a pattern is changed in phase. That is, the cell of the pattern is changed in the number of the sides constituting the outline of the cell. Another is the case that the pattern is not changed. Then, the resizing process is carried out based on the pattern only if it is changed to make the process speed higher.

SUMMARY OF THE INVENTION

Therefore, an object of the present invention is to provide a method of automatically correcting mask pattern data which can reduce an amount data treated to modify the mask pattern data and a program for the same.

Another object of the present invention is to provide a method of automatically correcting mask pattern data which can reduce a time needed to modify the mask pattern data and a program for the same.

Still another object of the present invention is to provide a method of automatically correcting mask pattern data which can easily design a semiconductor integrated circuit in a short period and a program for the same.

This and other objects, features and advantages of the present invention will be readily ascertained by referring to the following description and drawings.

In order to achieve an aspect of the present invention, the present invention provides a method of automatically correcting mask pattern data. In this mehod, the mask pattern data are for producing a plurality of photo masks used in manufacturing processes of a semiconductor integrated circuit where cells including dummy cells are placed on a semiconductor chip. The method includes: (a) merging tentatively an assistant mask layer into one of a plurality of main mask layers, wherein each of the plurality of main mask layers corresponds to one of the plurality of photomasks, the assistant mask layer includes a plurality of first regions, each of which corresponds to one of the dummy cells; (b) checking whether or not the one of the plurality of main mask layers and the merged assistant mask layer agree with a design rule; (c) replacing the one of the plurality of main mask layers with another one of the plurality of main mask layers, into which the assistant mask layer is merged, when a violation against the design rule is found in the step (b); and (d) converting the assistant mask layer into the merged one of the plurality of main mask layers, wherein the merged one of the plurality of main mask layers does not have a violation against the design rule.

The method of automatically correcting mask pattern data may further include (e) repeating the steps (a) to (c) before the step (d) until a violation against the design rule is not found.

The method of automatically correcting mask pattern data may further include (f) providing the assistant mask layer such that the plurality of first regions can be merged into at least one of the plurality of main mask layers.

In the method of automatically correcting mask pattern data, the step (a) may include (a1) merging tentatively the assistant mask layer into the one of the plurality of main mask layers such that each of the plurality of first regions is merged into adjacent one of a plurality of second regions which included in the one of the plurality of main mask layers.

In the method of automatically correcting mask pattern data, the step (a1) may include (a11) selecting the adjacent one of the plurality of second regions from the plurality of second regions by a predetermined priority, and (a12) merging tentatively the each of the plurality of first regions into the selected adjacent one of the plurality of second regions.

In the method of automatically correcting mask pattern data, the step (d) may include (d1) converting the assistant mask layer into the merged one of the plurality of main mask layers such that each of the plurality of first regions is converted into adjacent one of a plurality of second regions which included in the merged one of the plurality of main mask layers.

In the method of automatically correcting mask pattern data, the step (d1) may include (d11) selecting the adjacent one of the plurality of second regions from the plurality of second regions by a predetermined priority, and (d12) converting the each of the plurality of first regions into the selected adjacent one of the plurality of second regions.

In the method of automatically correcting mask pattern data, the step (d12) may include (d121) converting the each of the plurality of first regions into the selected adjacent one of the plurality of second regions such that one of the plurality of second regions is not surrounded and isolated by another plurality of second regions which is included in another of plurality of main mask layers.

The method of automatically correcting mask pattern data may further include (g) providing the assistant mask layer such that dimensions and placing positions of the plurality of first regions are predetermined to agrees with the design rule when the assistant mask layer is combined with one of the plurality of main mask layers.

In the method of automatically correcting mask pattern data, n the step (g) may include (g1) providing the assistant mask layer such that dimensions and placing positions of regions except for the plurality of first regions are predetermined to agrees with the design rule when the assistant mask layer is combined with one of the plurality of main mask layers.

In the method of automatically correcting mask pattern data, the step (a) may include (a2) selecting the one of the plurality of main mask layers from the plurality of main mask layers by a predetermined priority.

In the method of automatically correcting mask pattern data, the manufacturing processes of the semiconductor integrated circuit may be channel ion implantation processes for transistors in which various kinds of gate voltage are selected.

In order to achieve another aspect of the present invention, the present invention provides a computer program product for a method of automatically correcting mask pattern data. In the computer program product, the mask pattern data are for producing a plurality of photo masks used in manufacturing processes of a semiconductor integrated circuit where cells including dummy cells are placed on a semiconductor chip. The computer program product embodied on a computer-readable medium and including code that, when executed, causes a computer to perform the following: (a) merging tentatively an assistant mask layer into one of a plurality of main mask layers, wherein each of the plurality of main mask layers corresponds to one of the plurality of photo masks, the assistant mask layer includes a plurality of first regions, each of which corresponds to one of the dummy cells; (b) checking whether or not the one of the plurality of main mask layers and the merged assistant mask layer agree with a design rule; (c) replacing the one of the plurality of main mask layers with another one of the plurality of main mask layers, into which the assistant mask layer is merged, when a violation against the design rule is found in the step (b); and (d) converting the assistant mask layer into the merged one of the plurality of main mask layers, wherein the merged one of the plurality of main mask layers does not have a violation against the design rule.

The computer program product may further include (e) repeating the steps (a) to (c) before the step (d) until a violation against the design rule is not found.

The computer program product may further include (f) providing the assistant mask layer such that the plurality of first regions can be merged into at least one of the plurality of main mask layers.

In the computer program product, the step (a) may include (a1) merging tentatively the assistant mask layer into the one of the plurality of main mask layers such that each of the plurality of first regions is merged into adjacent one of a plurality of second regions which included in the one of the plurality of main mask layers.

In the computer program product, the step (a1) may include (a11) selecting the adjacent one of the plurality of second regions from the plurality of second regions by a predetermined priority, and (a12) merging tentatively the each of the plurality of first regions into the selected adjacent one of the plurality of second regions.

In the computer program product, the step (d) may include (d1) converting the assistant mask layer into the merged one of the plurality of main mask layers such that each of the plurality of first regions is converted into adjacent one of a plurality of second regions which included in the merged one of the plurality of main mask layers.

In the computer program product, the step (d1) may include (d11) selecting the adjacent one of the plurality of second regions from the plurality of second regions by a predetermined priority, and (d12) converting the each of the plurality of first regions into the selected adjacent one of the plurality of second regions.

In the computer program product, the step (d12) may include (d121) converting the each of the plurality of first regions into the selected adjacent one of the plurality of second regions such that one of the plurality of second regions is not surrounded and isolated by another plurality of second regions which is included in another of plurality of main mask layers.

The computer program product may further include (g) providing the assistant mask layer such that dimensions and placing positions of the plurality of first regions are predetermined to agrees with the design rule when the assistant mask layer is combined with one of the plurality of main mask layers.

IN the computer program product, the step (g) may include (g1) providing the assistant mask layer such that dimensions and placing positions of regions except for the plurality of first regions are predetermined to agrees with the design rule when the assistant mask layer is combined with one of the plurality of main mask layers.

In the computer program product, the step (a) may include (a2) selecting the one of the plurality of main mask layers from the plurality of main mask layers by a predetermined priority.

In the computer program product, the manufacturing processes of the semiconductor integrated circuit may be channel ion implantation processes for transistors in which various kinds of gate voltage are selected.

DESCRIPTION OF THE PREFERRED EMBODIMENTS

Embodiments of a method of automatically correcting a mask pattern data according to the present invention will be described below with reference to the attached drawings.

[Embodiment]

Figure 1:
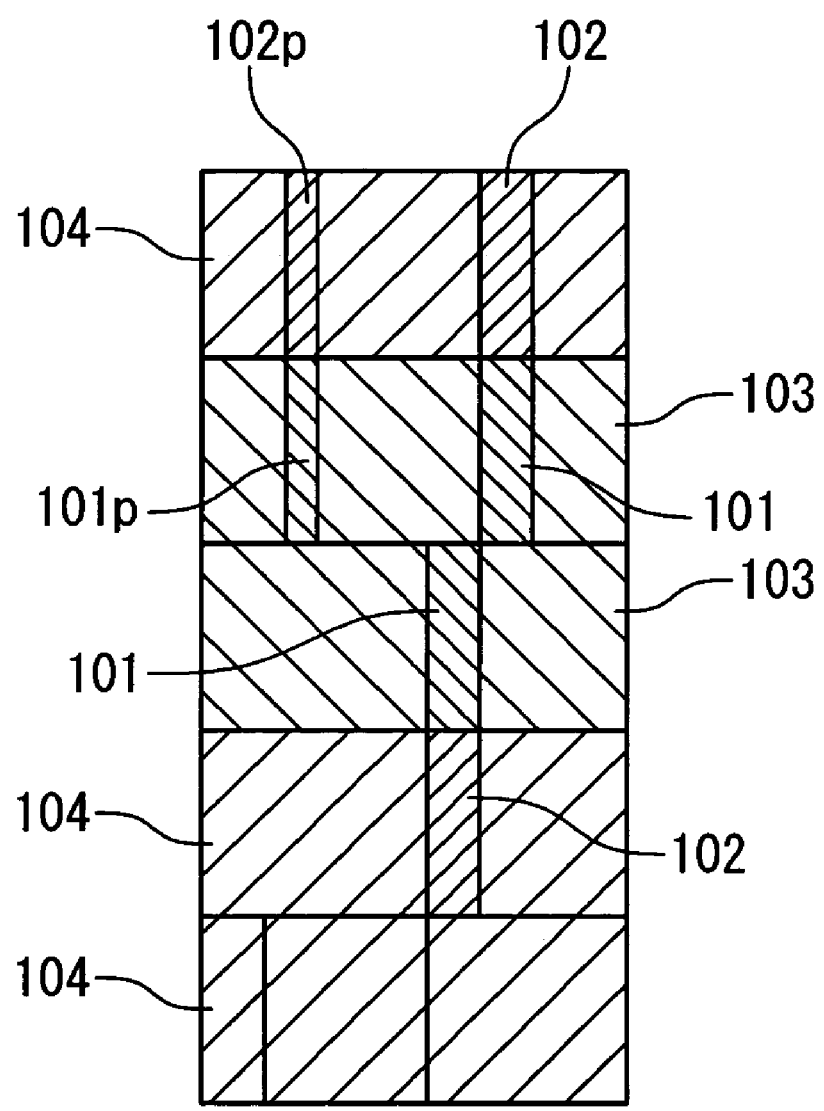
FIG. 1 is a view showing a conventional example of the mask pattern data.
Figure 2:
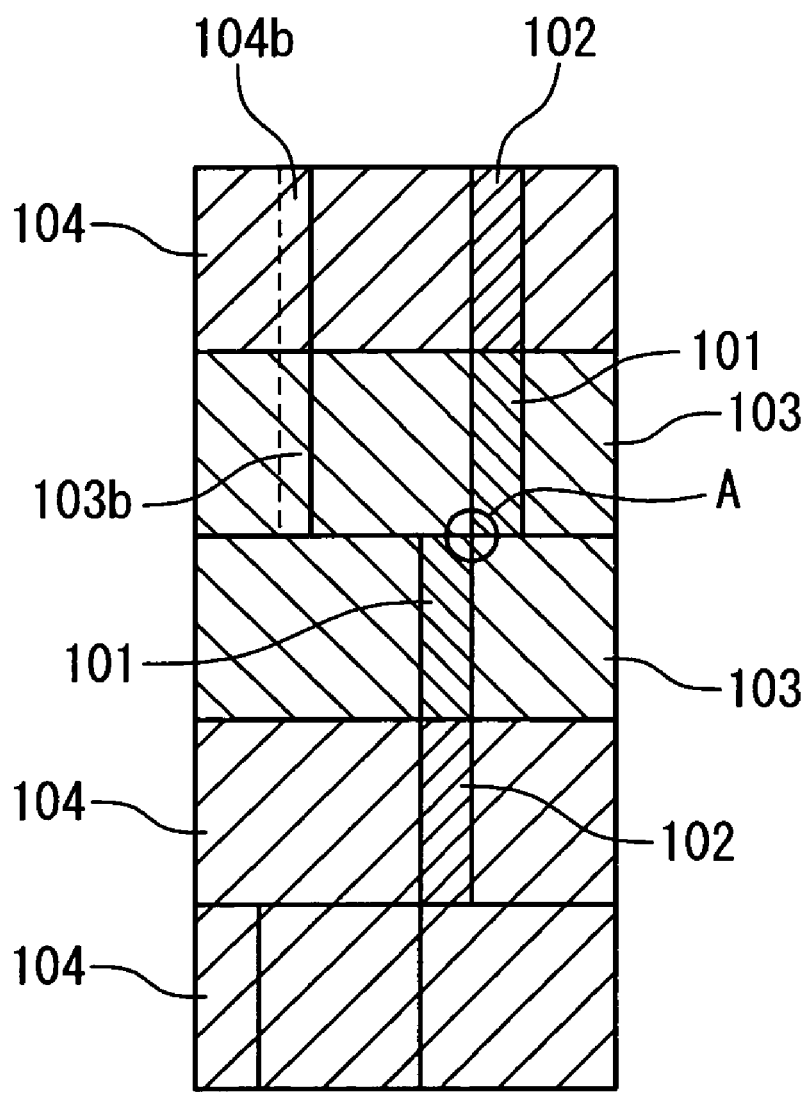
FIG. 2 is a view showing a conventional example of the mask pattern data.
Figure 3:
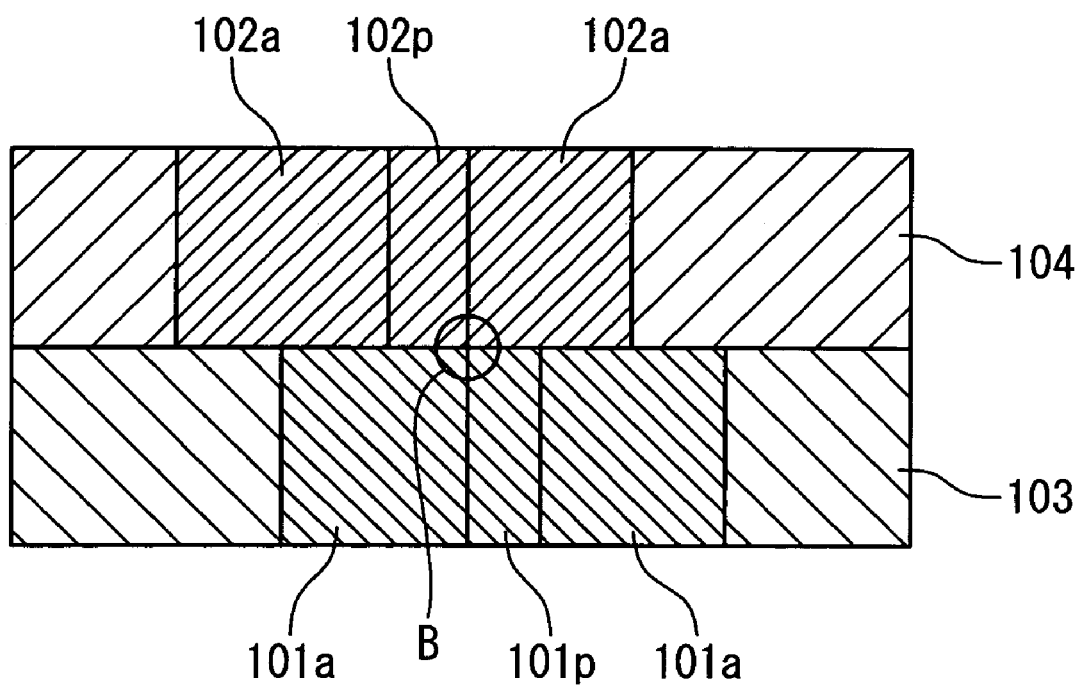
FIG. 3 is a view showing a conventional example of the mask pattern data.
Figure 4:
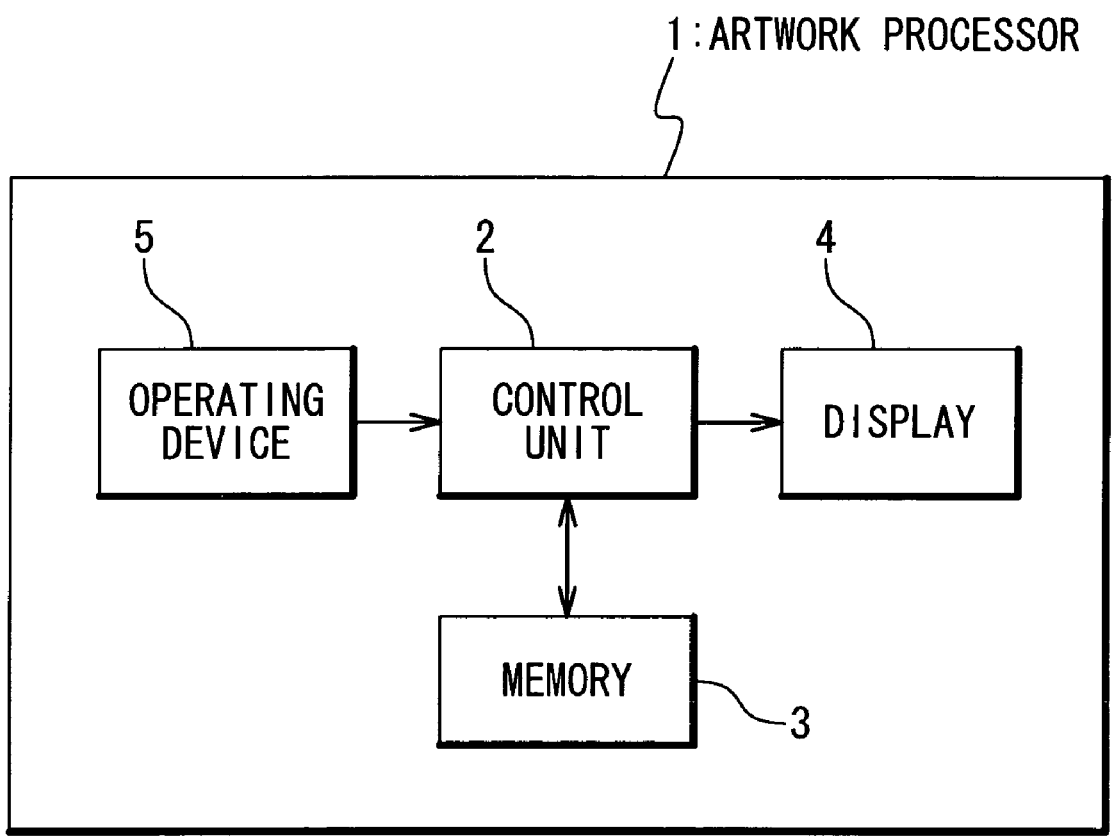
FIG. 4 is a block diagram showing the configuration of an artwork processor of the embodiment of the present invention, which executes the method of automatically correcting the mask pattern data.

FIG. 4 is a block diagram showing the configuration of an artwork processor of the embodiment of the present invention, which executes the method of automatically correcting the mask pattern data.

The method of automatically correcting the mask pattern data is executed in such a way that a program of automatically correcting mask pattern data is installed in an artwork processor 1 shown in FIG. 4.

The artwork processor 1 is an information processor such as a workstation and a PC. The artwork processor 1 includes a control unit 2 having CPU, a memory 3, a display 4 and an operating device 5.

The memory 3 is composed of an inner memory and an outer memory. The inner memory is exemplified as semiconductor memories such as a ROM, and a RAM. The outer memory is exemplified as a flexible (floppy) disc (FD) drive, a hard disc (HD) drive, a magneto-optical (MO) disc drive, a CD (Compact Disc)/DVD (Digital Versatile Disc) drive for a CD-ROM, a CD-R (Recordable), a CD-RW (ReWritable), a DVD-ROM, a DVD-R and DVD-RW, and a magnetic tape device.

The display 4 is exemplified as a CRT display, a liquid crystal display, and a plasma display. Also, the operating device 5 is exemplified as a keyboard, and a mouse.

The method of automatically correcting the mask pattern data is stored in the storing medium, such as the FD, the HD, the MO disc, the CD-ROM, the CD-R, the CD-RW, the DVD-ROM, the DVD-R, the DVD-RW, and the magnetic tape, as the program of automatically correcting the mask pattern data. The storing medium is inserted into the appropriate outer memory. The program is read out and loaded into the RAM at a time of execution. This storing medium may be the semiconductor memory such as the ROM or the like.

The memory 3 stores the library. In the library, the data such as a semiconductor chip data and the mask pattern data (artwork data) as the layout design result are included (described). The memory 3 also stores the program for automatically correcting the mask pattern data, the automatic placement and routing tool, a mask pattern data verifying program including a design rule checking program, a mask layer synthesizing program and the like, as design support programs of a semiconductor integrated circuit.

Here, the memory 3 stores mask layers and changing layers (gds layers) to produce photo masks that are used in each semiconductor manufacturing step, as the data to form cells including dummy cells.

As the mask layer, for example, two kinds of mask layers to produce the photo mask used in a channel ion implanting step of a transistor are provided in this example. Each of two kinds of mask layers is selected correspondingly to each of two kinds of gate threshold voltages of the transistors. Hereafter, the gate threshold voltage is referred to as Vt.

Figure 5:
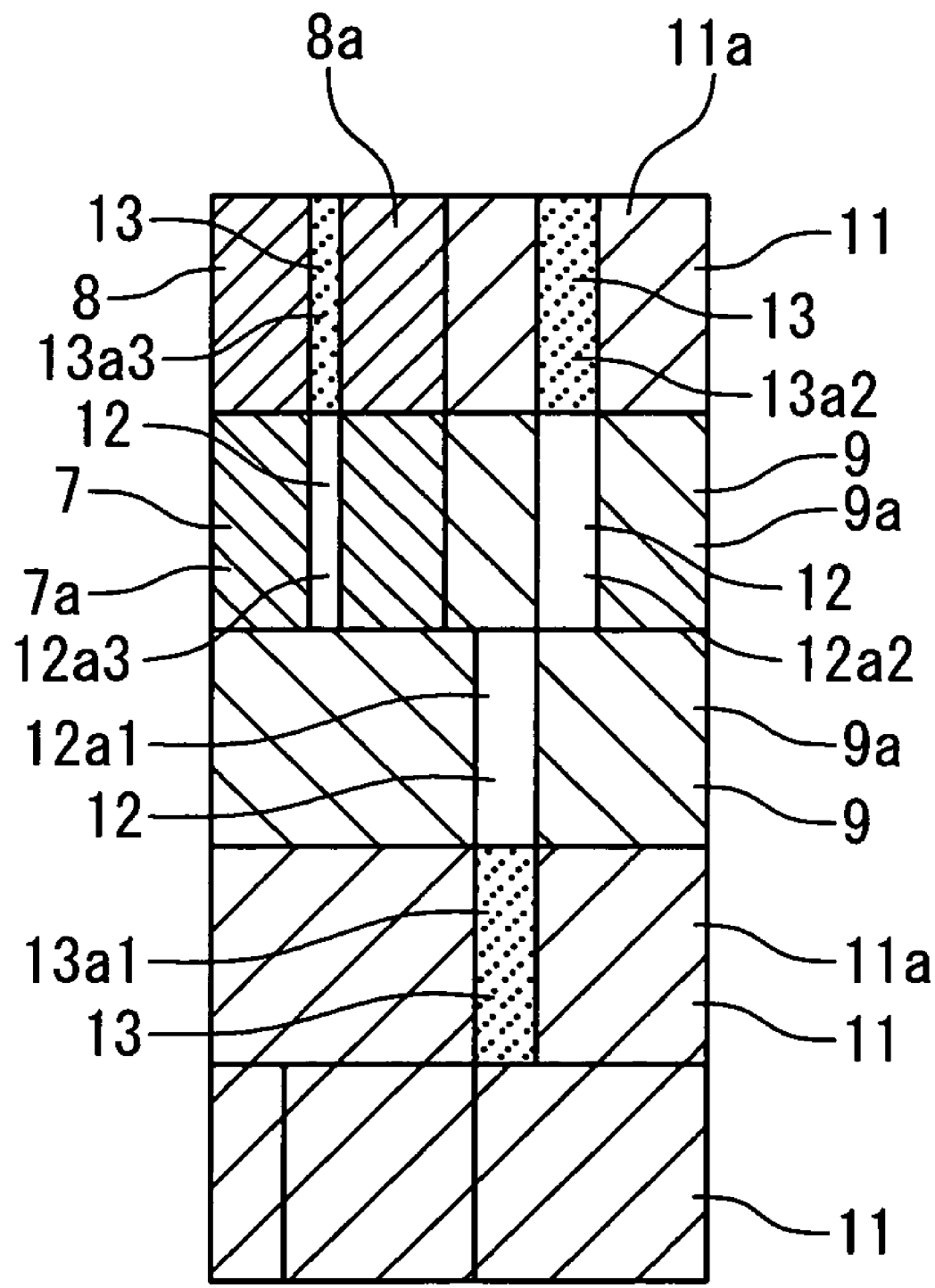
FIG. 5 is a view explaining the mask pattern data of the embodiment.

FIG. 5 is a view explaining the mask pattern data of the embodiment.

That is, one of two kinds of mask layers is an ion implanting mask layer for forming a low Vt transistor (hereafter, referred to as an HPTr (High Performance Transistor) implantation layer). In the HPTr implantation layer, an ion dose of the ion implantation is relatively low to make the Vt lower. Another of two kinds of mask layers is an ion implantation mask layer for forming a high Vt transistor (hereafter, referred to as an MPTr (Middle Performance Transistor) implantation layer). In the MPTr implantation layer, an ion dose of the ion implantation is relatively high to make the Vt higher. Each of two mask layers includes the mask layer for N-channel (hereafter, referred to as an N-ch) ion implantation and the mask layer for P-channel (hereafter, referred to as a P-ch) ion implantation. Here, as shown in FIG. 5, an N-ch HPTr implantation layer 7, a P-ch HPTr implantation layer 8, an N-ch MPTr implantation layer 9 and a P-ch MPTr implantation layer 11 are used as main mask layers.

Also in this example, as shown in FIG. 5, an N-ch changing layer 12 and a P-ch changing layer 13 are provided as assistant mask layers. In the N-ch changing layer 12, rectangular regions (corresponding to open regions of a photo mask) are placed at positions corresponding to dummy cells. The N-ch changing layer 12 is stored at the state that the rectangular regions can be absorbed into one of rectangular regions of the N-ch HPTr implantation layer 7 and the N-ch MPTr implantation layer 9 when the mask layer is synthesized (generated). Here, each of the rectangular regions can be selected as a part of any implantation layer. Also, the P-ch changing layer 13 is stored at the state that the rectangular regions can be absorbed into one of rectangular regions of the P-ch HPTr implantation layer 8 and the P-ch MPTr implantation layer 11 when the mask layer is synthesized (generated). Here, each of the rectangular regions can be selected as a part of any implantation layer.

FIG. 5 shows the a part of the situation that the respective rectangular regions corresponding to the open regions of the photo mask are placed and arrayed without any gap when they are viewed in plan. In this situation, the N-ch HPTr implantation layer 7, the P-ch HPTr implantation layer 8, the N-ch MPTr implantation layer 9, the P-ch MPTr implantation layer 11, the N-ch changing layer 12 and the P-ch changing layer 13 are stacked.

Also in this example, the width, the area and the like of the rectangular regions constituting the changing layers are predetermined so as to satisfy the design rules by selecting any one of the two kinds of the mask layers used at the same manufacturing step. Here, the two kinds of the mask layers are the N-ch HPTr implantation layer 7 and the N-ch MPTr implantation layer 9 for the N-ch changing layer 12. Also, the two kinds of the mask layers are the P-ch HPTr implantation layer 8 and the P-ch MPTr implantation layer 11 for the P-ch changing layer 13. The same manufacturing step is, for example, the channel ion implanting step of the transistor in which the Vt is selected (predetermined).

That is, the width and area of the rectangular region of the changing layer, the width and area of the space other than the above-mentioned rectangular region, the positions of the placement and the like are set. Here, the rectangular region corresponds to the open region of the photo mask. The space corresponds to the non-open region of the photo mask.

Also, the placement is designed, for example, so as not to form the donut region (island (isolated) region) where the rectangular region of the MPTr implantation layer is placed in isolation surrounded by the rectangular regions of the many HPTr implantation layers in the small region, in the situation that the N-ch HPTr implantation layer 7, the P-ch HPTr implantation layer 8, the N-ch MPTr implantation layer 9, the P-ch MPTr implantation layer 11, the N-ch changing layer 12 and the P-ch changing layer 13 are stacked.

Similarly, the placement is designed, for example, so as not to form the donut region (island region) where the rectangular region of the HPTr implantation layer is placed in isolation surrounded by the rectangular regions of the many MPTr implantation layers in the small region, in the situation that the implantation layers (7, 8, 9, 11, 12 and 13) are stacked.

Moreover, in this example, the rectangular region of the changing layer is predetermined such that its area is sufficiently reserved. Thus, whether or not the changing layer is suitable can be judged by checking at least its width.

The program for automatically correcting the mask pattern data includes the steps (a) to (d). The step (a) has a procedure for tentatively setting, for example, all of the rectangular regions of the N-ch changing layers as the rectangular regions of the N-ch HPTr implantation layer or the rectangular regions of the N-ch MPTr implantation layer, and then tentatively synthesizing (merging) the N-ch changing layer and the N-ch HPTr implantation layer or the N-ch MPTr implantation layer. Also, the step (a) has a procedure for tentatively setting, for example, all of the rectangular regions of the P-ch changing layers as the rectangular regions of the P-ch HPTr implantation layer or the rectangular regions of the P-ch MPTr implantation layer, and then tentatively synthesizing (merging) the P-ch changing layer and the P-ch HPTr implantation layer or the P-ch MPTr implantation layer. The step (b) has a procedure for carrying out a design rule checking process for checking whether or not the widths of the respective rectangular regions and the like agree with the design rule. The step (c) has a procedure for converting the rectangular region of the N-ch changing layer of a design rule violation portion into the rectangular region of the N-ch MPTr implantation layer or the rectangular region of the N-ch HPTr implantation layer, if the design rule violation is detected. Also, the step (c) has a procedure for converting the rectangular region of the P-ch changing layer of a design rule violation portion into the rectangular region of the P-ch MPTr implantation layer or the rectangular region of the P-ch HPTr implantation layer, if the design rule violation is detected. The step (d) has a procedure for converting the rectangular region of the N-ch changing layer of a design rule agreement portion into the rectangular region of the N-ch HPTr implantation layer or the rectangular region of the N-ch MPTr implantation layer at the originally tentatively setting state. Also, the step (d) has a procedure for converting the rectangular region of the P-ch changing layer of a design rule agreement portion into the rectangular region of the P-ch HPTr implantation layer or the rectangular region of the P-ch MPTr implantation layer at the originally tentatively setting state.

Here, the priority as to whether all of the rectangular regions of the N-ch changing layers are tentatively set as the rectangular regions of the N-ch HPTr implantation layer or tentatively set as the rectangular regions of the N-ch MPTr implantation layer is predetermined. Also, the priority as to whether all of the rectangular regions of the P-ch changing layers are tentatively set as the rectangular regions of the P-ch HPTr implantation layer or tentatively set as the rectangular regions of the P-ch MPTr implantation layer is predetermined.

Thus, for example, the rectangular region of the N-ch changing layer is absorbed into the rectangular region of the N-ch HPTr implantation layer if the rectangular region of the N-ch HPTr implantation layer is adjacent to this rectangular region of the N-ch changing layer. Also, the rectangular region of the P-ch changing layer is absorbed into the rectangular region of the P-ch HPTr implantation layer if the rectangular region of the P-ch HPTr implantation layer is adjacent to this rectangular region of the P-ch changing layer.

Here, for example, if the rectangular regions of the N-ch HPTr implantation layers are adjacent to both sides of the rectangular region of the N-ch changing layer, the rectangular region of the N-ch changing layer is absorbed into any one of the rectangular regions of the N-ch HPTr implantation layers. In this case, the priority with regard to the absorption into any one of them is also predetermined. Also, if the rectangular regions of the P-ch HPTr implantation layers are adjacent to both sides of the rectangular region of the P-ch changing layer, the rectangular region of the P-ch changing layer is absorbed into any one of the rectangular regions of the P-ch HPTr implantation layers. In this case, the priority with regard to the absorption into any one of them is also predetermined.

Figure 7:
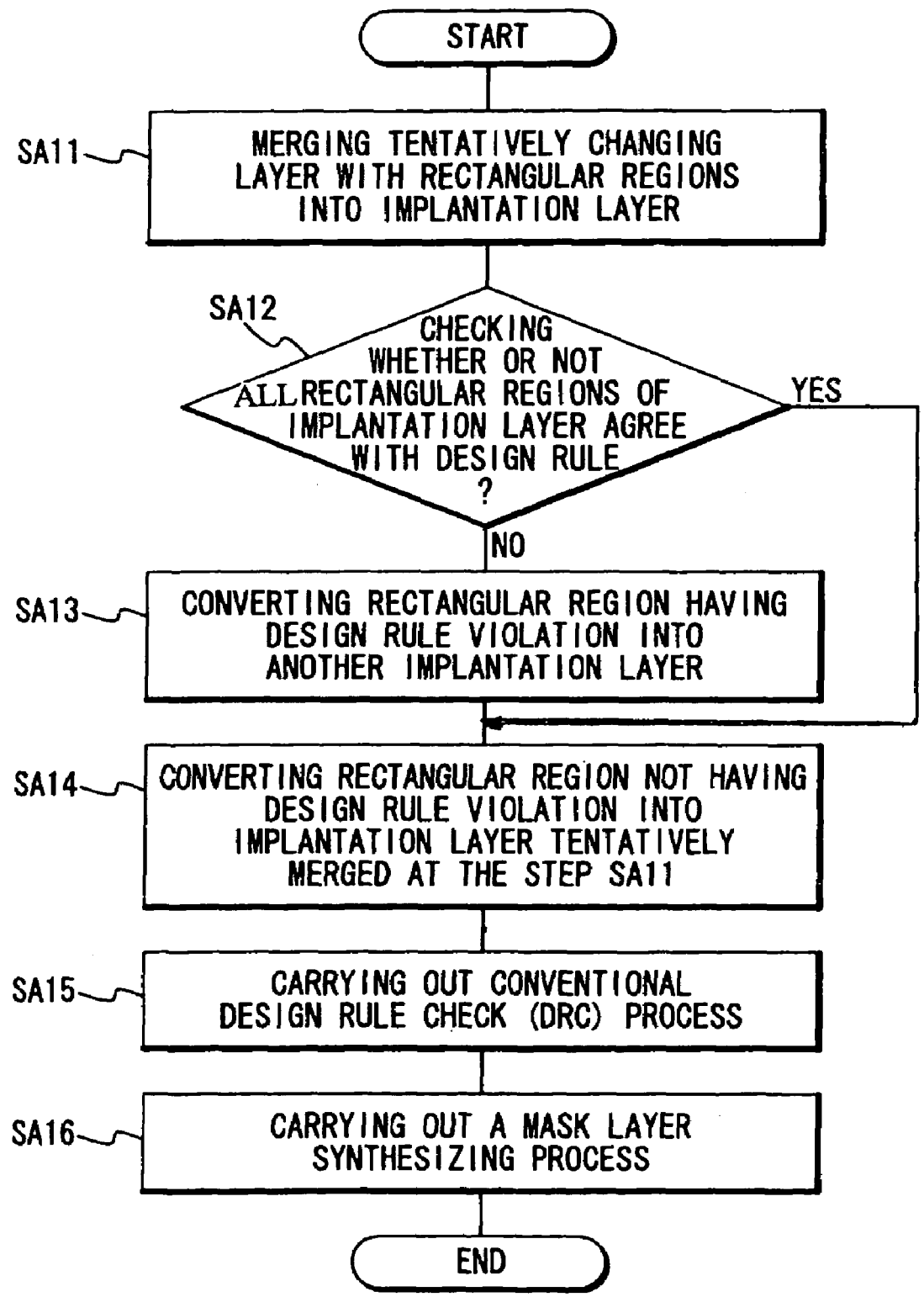
FIG. 7 is a flowchart showing the embodiment of the method of automatically correcting the mask pattern data of the present invention.

The method of automatically correcting the mask pattern data in this embodiment will be described below with reference to a flowchart shown in FIG. 5 and FIG. 7. FIG. 7 is a flowchart showing the embodiment of the method of automatically correcting the mask pattern data of the present invention. In the following explanation, the case of preparing the mask pattern data for the channel ion implantation when the two kinds of the transistors are mixed and placed on the substrate is described as an example. Here, the two kinds of the transistors imply the HPTr and the MPTr.

Those two kinds of the transistors include the N-ch transistors and the P-ch transistors, respectively. Here, the gate length and the oxide film thickness of the HPTr are set to be equal to those of the MPTr.

The control unit 2 executes the automatic placement and routing process in response to the operation of the operating person (designer). That is, the control unit 2 places the cells at the desired positions on the semiconductor chip based on the data of the semiconductor chip and the data of the cells. The data of the semiconductor chip and the data of the cells are read out from the memory 3. Moreover, the control unit 2 places the dummy cells so as to embed in the gap between the cells.

Here, the mask pattern data are generated to produce the many photo masks. For example, as the mask pattern data for the channel ion implantation, the respective mask layers, where the rectangular regions (corresponding to the open regions of the photo masks) corresponding to the respective cells including the dummy cells are placed, are generated.

That is, as shown in FIG. 5, the N-ch HPTr implantation layer 7, the P-ch HPTr implantation layer 8, the N-ch MPTr implantation layer 9, the P-ch MPTr implantation layer 11, the N-ch changing layer 12 and the P-ch changing layer 13 are generated.

Here, rectangular regions 7a, 8a, 9a and 11a of the N-ch HPTr implantation layer 7, the P-ch HPTr implantation layer 8, the N-ch MPTr implantation layer 9 and the P-ch MPTr implantation layer 11 are generated correspondingly to the respective cells. Also, rectangular regions 12a and 13a of the N-ch changing layer 12 and the P-ch changing layer 13 are generated correspondingly to the respective dummy cells.

In this case, for example, the rectangular region 12a1 of the N-ch changing layer will be determined as any of the rectangular region 7a of the N-ch HPTr implantation layer 7 and the rectangular region 9a of the N-ch MPTr implantation layer 9. Then, the rectangular region 12a1 will be synthesized (merged) with the rectangular region 7a or the rectangular region 9a. Similarly, the rectangular region 13a1 of the P-ch changing layer will be determined as any of the rectangular region 8a of the P-ch HPTr implantation layer 8 and the rectangular region 11a of the P-ch MPTr implantation layer 11. Then, the rectangular region 13a1 will be synthesized with the rectangular region 8a of the P-ch HPTr implantation layer 8 or the rectangular region 11a of the P-ch MPTr implantation layer 11.

Next, the control unit 2 verifies the mask pattern data while carrying out the routing between the cells.

The control unit 2 tentatively sets all of the rectangular regions 12a (ex. 12a1, 12a2, 12a3) of the N-ch changing layer 12 as any of the rectangular region 7a of the N-ch HPTr implantation layer 7 and the rectangular region 9a of the N-ch MPTr implantation layer 9. Then, the control unit 2 tentatively merges (synthesizes) the N-ch changing layer 12 into the above-set implantation layer (any of the N-ch HPTr implantation layer 7 and the N-ch MPTr implantation layer 9). Also, the control unit 2 tentatively sets all of the rectangular regions 13a (ex. 13a1, 13a2, 13a3) of the P-ch changing layer 13 as any of the rectangular region 8a of the P-ch HPTr implantation layer 8 and the rectangular region 11a of the P-ch MPTr implantation layer 11. Then, the control unit 2 tentatively merges (synthesizes) the P-ch changing layer 13 into the above-set implantation layer (any of the P-ch HPTr implantation layer 8 and the P-ch MPTr implantation layer 11) (Step SA11).

In this example, the control unit 2 tentatively sets all of the rectangular regions 12a (ex. 12a1, 12a2, 12a3) of the N-ch changing layer 12 as the rectangular region 9a of the N-ch MPTr implantation layer 9. Then, the control unit 2 tentatively merges the N-ch changing layer 12 corresponding to the rectangular regions 12a into the N-ch MPTr implantation layer 9.

Similarly, the control unit 2 tentatively sets all of the rectangular regions 13a (ex. 13a1, 13a2, 13a3) of the P-ch changing layer 13 as the rectangular region 11a of the P-ch MPTr implantation layer 11. Then, the control unit 2 tentatively merges the P-ch changing layer 13 corresponding to the rectangular regions 13a into the P-ch MPTr implantation layer 11.

The priority as to whether the rectangular region 12a is tentatively set as any of the rectangular region 9a, the rectangular region 11a, the rectangular regions 7a and the rectangular regions 8a is predetermined. Also, the priority as to whether the rectangular region 13a is tentatively set as any of the rectangular region 9a, the rectangular region 11a, the rectangular regions 7a and the rectangular regions 8a is predetermined.

Next, the control unit 2 carries out the design rule checking process for checking whether or not the widths of all of the respective rectangular regions and the like agree with the design rule (Step SA12).

The control unit 2 proceeds to a step SA15 if the design rule violation is not detected at the step SA12.

On the other hand, if the design rule violation is detected at the step SA12, the control unit 2 converts the rectangular region 12a having the design rule violation into the rectangular region 7a of the N-ch HPTr implantation layer 7.

Similarly, if the design rule violation is detected at the step SA12, the control unit 2 converts the rectangular region 13a having the design rule violation into the rectangular region 8a of the P-ch HPTr implantation layer 8 (Step SA13).

Figure 6:
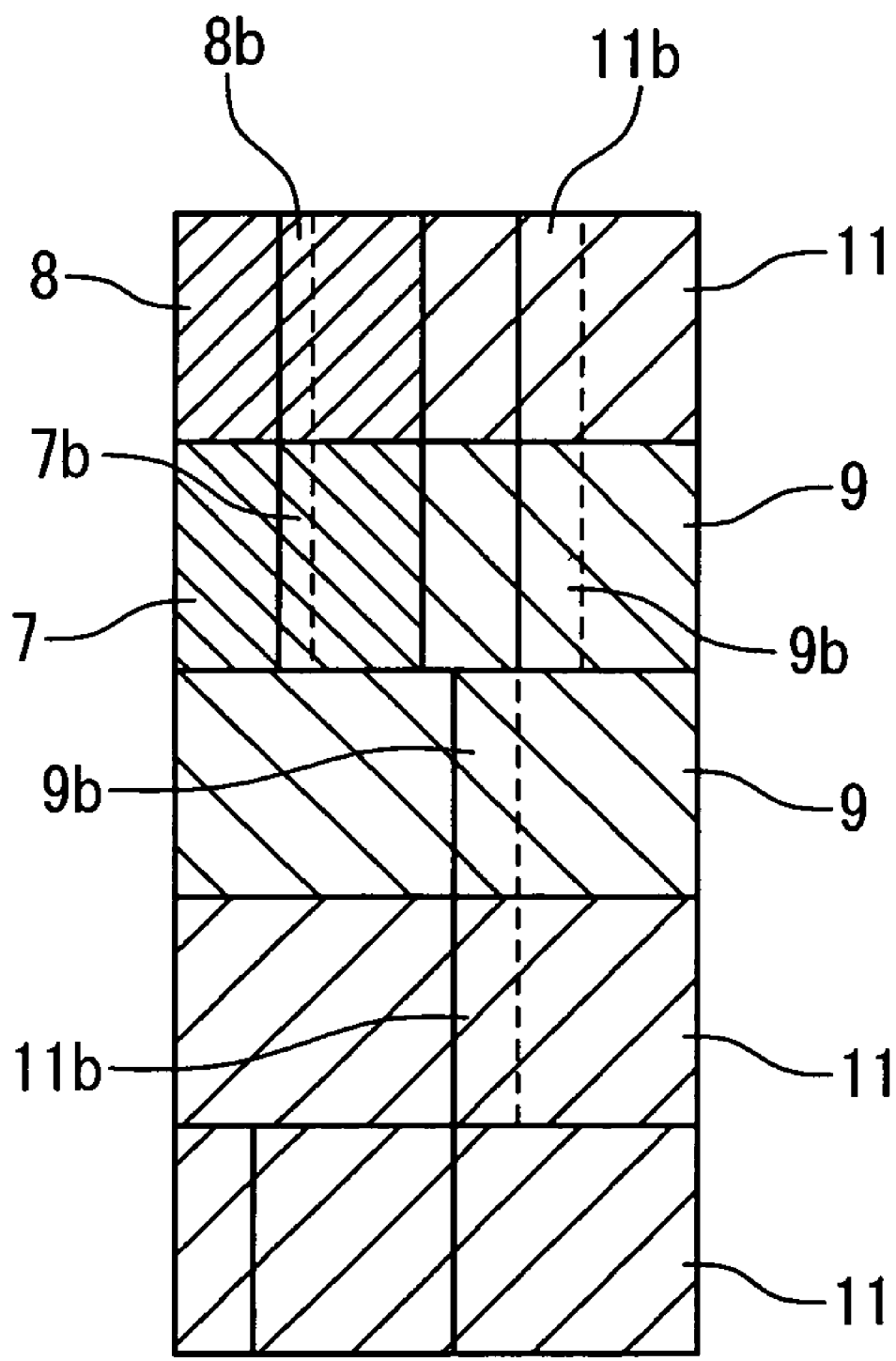
FIG. 6 is a view explaining the mask pattern data of the embodiment.

FIG. 6 is a view explaining the mask pattern data of the embodiment.

Consequently, as shown in FIG. 6, the rectangular region 12a3 of the N-ch changing layer 12 is absorbed into the rectangular region 7a of the N-ch HPTr implantation layer 7 and becomes a rectangular region 7b, if the rectangular region 7a is adjacent to the rectangular region 12a3. The rectangular region 12a2 of the N-ch changing layer 12 is absorbed into the rectangular region 9a of the N-ch MPTr implantation layer 9 and becomes a rectangular region 9b, if the rectangular region 9a is adjacent to the rectangular region 12a2.

Similarly, as shown in FIG. 6, the rectangular region 13a3 of the P-ch changing layer 13 is absorbed into the rectangular region 8a of the P-ch HPTr implantation layer 8 and becomes a rectangular region 8b, if the rectangular region 8a is adjacent to the rectangular region 13a3. The rectangular region 13a2 of the P-ch changing layer 13 is absorbed into the rectangular region 11a of the P-ch MPTr implantation layer 11 and becomes a rectangular region 11b, if the rectangular region 11a is adjacent to the rectangular region 13a2.

Here, for example, if two rectangular regions 7a of the N-ch HPTr implantation layer 7 are adjacent to both sides of the rectangular region 12a of the N-ch changing layer 12, the rectangular region 12a is absorbed into the rectangular region 7a in the predetermined side. Also, for example, if the rectangular regions 8a of the P-ch HPTr implantation layer 8 are adjacent to both sides of the rectangular region 13a of the P-ch changing layer 13, the rectangular region 13a is absorbed into the rectangular region 8a in the predetermined side.

Next, the control unit 2 converts the rectangular region 12a of the N-ch changing layer 12 which does not have the design rule violation into the rectangular region 9a of the N-ch MPTr implantation layer 9, which has tentatively been set at the step SA11. Also, the control unit 2 converts the rectangular region 13a of the P-ch changing layer 13 which does not have the design rule violation into the rectangular region 11a of the P-ch MPTr implantation layer 11, which has tentatively been set at the step SA11 (Step SA14).

Consequently, as shown in FIG. 6, the rectangular region 12a1 of the N-ch changing layer 12 is absorbed into the rectangular region 9a of the N-ch MPTr implantation layer 9 and becomes a rectangular region 9b, if the rectangular region 9a is adjacent to the rectangular region 12a1. Similarly, as shown in FIG. 6, the rectangular region 13a1 of the P-ch changing layer 13 is absorbed into the rectangular region 11a of the P-ch MPTr implantation layer 11 and becomes a rectangular region 11b, if the rectangular region 11a is adjacent to the rectangular region 13a1.

Here, for example, if two rectangular regions 9a of the N-ch MPTr implantation layer 9 are adjacent to both sides of the rectangular region 12a of the N-ch changing layer 12, the rectangular region 12a is absorbed into the rectangular region 9a in the predetermined side. Also, for example, if two rectangular regions 11a of the P-ch MPTr implantation layer 11 are adjacent to both sides of the rectangular region 13a of the P-ch changing layer 13, the rectangular region 13a is absorbed into the rectangular region 11a in the predetermined side.

In this way, after the execution of the pre-processing, the control unit 2 carries out the conventional design rule check (DRC) process (Step SA15). Then, the control unit 2 carries out a mask layer synthesizing process (Step SA16).

In this mask layer synthesizing process, the four layers of the N-ch HPTr implantation layer, the P-ch HPTr implantation layer, the N-ch MPTr implantation layer and the P-ch MPTr implantation layer are formed from the six layers of the N-ch HPTr implantation layer 7, the P-ch HPTr implantation layer 8, the N-ch MPTr implantation layer 9, the P-ch MPTr implantation layer 11, the N-ch changing layer 12 and the P-ch changing layer 13.

In this way, according to the configuration of this example, the process for correcting the mask pattern data is as follows. Firstly, the N-ch changing layer 12 is tentatively synthesized with the N-ch HPTr implantation layer 7 or the N-ch MPTr implantation layer 9 such that the rectangular regions 12a are included in the rectangular region 7a or the rectangular region 9a. Next, the result is checked whether or not it agrees with the design rule. Then, each rectangular region 12a of the N-ch changing layer 12 is merged into any one of the rectangular region 7a of the N-ch HPTr implantation layer 7 and the rectangular region 9a of the N-ch MPTr implantation layer 9, which does not have the design rule violation. Also, firstly, the P-ch changing layer 13 is tentatively synthesized with the P-ch HPTr implantation layer 8 or the P-ch MPTr implantation layer 11 such that the rectangular regions 13a are included in the rectangular region 8a or the rectangular region 11a. Next, the result is checked whether or not it agrees with the design rule. Then, each rectangular region 13a of the P-ch changing layer 13 is merged into any one of the rectangular region 8a of the P-ch HPTr implantation layer 8 and the rectangular region 11a of the P-ch MPTr implantation layer 11, which does not have the design rule violation. Thus, the design rule violation can be detected at the early stage, and the mask pattern data can be smoothly corrected.

Thus, it is possible to reduce the data amount treated to modify the mask pattern data, reduce the time required to modify the mask pattern data, and possible to design the semiconductor integrated circuit easily in a short period.

Also, it is not necessary to modify the existing automatic placement and routing tool for carrying out the above-mentioned process.

Also, it is not necessary to execute the resizing process by carrying out the above-mentioned process. Thus, as compared with the conventional technique in which the resizing process is frequently used and the concealed design rule violation cannot be detected at the early stage, the mask pattern data can be surely verified, thereby avoiding the trouble that the design rule violation is detected, for example, immediately before the mask formation.

As mentioned above, the embodiment of the present invention has been described in detail with reference to the drawings. However, the concrete configuration is not limited to this embodiment. The change, modification and the like within the scope of the present invention are included in the present invention.

For example, the embodiment is described about the case of performing the process for correcting the mask pattern data (the pre-processing) prior to the usual verifying process, on the rectangular regions of all of the changing layers arranged correspondingly to the dummy cells. However, the pre-processing may be omitted for the changing layer which evidently satisfies the design rule.

Also, the case of forming the two kinds of the mask layers has been described. However, it can be applied to even the case of the three kinds or more. For example, as for the mask layer for the channel ion implantation, with regard to each of the N-ch ion implantation and the P-ch ion implantation, in addition to the ion implanting mask layer to form the low Vt transistor and the ion implanting mask layer to form the high Vt transistor, the ion implanting mask layer to form the transistor may be used in which the ion dose of the ion implantation is further reduced over the low Vt transistor so that the Vt is further reduced.

Also, in the embodiment, the case is described in which the rectangular regions of the changing layers are absorbed into the rectangular regions of the implantation layers as the mask layers adjacent to each other along the width directions in the rectangular regions of the changing layers. However, as necessary, the rectangular regions of the changing layers may be absorbed into the rectangular regions of the implantation layers adjacent to each other along the height direction.

Also, the shape of the region corresponding to the open region of the photo mask to form the cell including the dummy cell is not limited to the rectangle, and it may be the typical polygon (including a circle, an ellipse and the like). For example, it may be the concave or convex shape in which the ellipse and the rectangle are combined.

Also, in the embodiment, the case is described in which the program of the automatically correcting the mask pattern data is assumed to be the independent program. However, it may be included in the automatic placement and routing or may be included in the mask pattern data verifying program.

Also, in the embodiment, the case of executing the step SA14 after executing the step SA13 is described. However, the step SA14 may be early executed, or both steps may be executed in parallel.

This can be applied to a process of producing a photo mask used at a well forming step, in addition to an above-mentioned process of the producing the photo mask used in the channel ion implanting step of the transistor.

According to the present invention, a method of automatically correcting a mask pattern data is performed. In the method, firstly, respective polygonal regions (ex. rectangular regions) constituting an assistant mask layer (ex. a changing layer) is set as a part of one main mask layer among a plurality of main mask layers (ex. ion implantation layer), by combining the main mask layer and the assistant mask layer. Next, that result is checked whether or not it agrees with the design rule. Then, the polygonal region of the assistant mask layer is included into the main mask layer agreeing with the design rule. Thus, the design rule violation can be detected at an early stage, and the mask pattern data can be smoothly corrected, which can reduce the data amount treated to modify the mask pattern data and can reduce the time required to modify the mask pattern data, and can easily design the semiconductor integrated circuit in a short period.

Also, the method of automatically correcting a mask pattern is performed such that the respective polygonal regions (ex. the rectangular regions) constituting the assistant mask layer (ex. the changing layer) serve as the part of one main mask layer among the plurality of main mask layers (ex. the ion implantation layer), by combining the main mask layer and the assistant mask layer, checking whether or not it agrees with the design rule, and including the polygonal region of the assistant mask layer within the main mask layer agreeing with the design rule. Thus, it is not necessary to modify an existing automatic placement and routing tool.

Also, it is not necessary to execute the resizing process by carrying out the above-mentioned process. Thus, as compared with the conventional technique in which the resizing process is frequently used and the concealed design rule violation cannot be detected at the early stage, the mask pattern data can be surely verified, thereby avoiding a trouble that the design rule violation is detected immediately before the mask formation.

What is claimed is:

1. A method of automatically correcting mask pattern data, wherein said mask pattern data is for producing a plurality of photo masks used in manufacturing processes of a semiconductor integrated circuit where cells including dummy cells are placed on a semiconductor chip, said method comprising:

(a) merging tentatively an assistant mask layer into one of a plurality of main mask layers, wherein each of said plurality of main mask layers corresponds to one of said plurality of photo masks, said assistant mask layer includes a plurality of first regions, each of which corresponds to one of said dummy cells;

(b) checking whether or not said one of the plurality of main mask layers and said merged assistant mask layer agree with a design rule;

(c) replacing said one of the plurality of main mask layers with another one of said plurality of main mask layers, into which said assistant mask layer is merged, when a violation against said design rule is found in said step (b); and (d) converting said assistant mask layer into said merged one of said plurality of main mask layers, wherein said merged one of the plurality of main mask layers does not have a violation against said design rule.

2. The method of automatically correcting mask pattern data according to claim 1, further comprising:
(e) repeating said steps (a) to (c) before said step (d) until a violation against said design rule is not found.

3. The method of automatically correcting mask pattern data according to claim 1, further comprising:
(f) providing said assistant mask layer such that said plurality of first regions can be merged into at least one of said plurality of main mask layers.

4. The method of automatically correcting mask pattern data according to claim 1, wherein said step (a) includes:
(a1) merging tentatively said assistant mask layer into said one of the plurality of main mask layers such that each of said plurality of first regions is merged into adjacent one of a plurality of second regions which included in said one of the plurality of main mask layers.

5. The method of automatically correcting mask pattern data according to claim 4, wherein said step (a1) includes:
(a11) selecting said adjacent one of the plurality of second regions from said plurality of second regions by a predetermined priority, and
(a12) merging tentatively said each of the plurality of first regions into said selected adjacent one of the plurality of second regions.

6. The method of automatically correcting mask pattern data according to claim 1, wherein said step (d) includes:
(d1) converting said assistant mask layer into said merged one of said plurality of main mask layers such that each of said plurality of first regions is converted into adjacent one of a plurality of second regions which included in said merged one of the plurality of main mask layers.

7. The method of automatically correcting mask pattern data according to claim 6, wherein said step (d1) includes:
(d11) selecting said adjacent one of the plurality of second regions from said plurality of second regions by a predetermined priority, and
(d12) converting said each of the plurality of first regions into said selected adjacent one of the plurality of second regions.

8. The method of automatically correcting mask pattern data according to claim 7, wherein said step (d12) includes:
(d121) converting said each of the plurality of first regions into said selected adjacent one of the plurality of second regions such that one of said plurality of second regions is not surrounded and isolated by another plurality of second regions which is included in another of plurality of main mask layers.

9. The method of automatically correcting mask pattern data according to claim 1, further comprising:
(g) providing said assistant mask layer such that dimensions and placing positions of said plurality of first regions are predetermined to agrees with said design rule when said assistant mask layer is combined with one of said plurality of main mask layers.

10. The method of automatically correcting mask pattern data according to claim 9, wherein said step (g) includes:
(g1) providing said assistant mask layer such that dimensions and placing positions of regions except for said plurality of first regions are predetermined to agrees with said design rule when said assistant mask layer is combined with one of said plurality of main mask layers.

11. The method of automatically correcting mask pattern data according to claim 1, wherein said step (a) includes:
(a2) selecting said one of the plurality of main mask layers from said plurality of main mask layers by a predetermined priority.

12. The method of automatically correcting mask pattern data according to claim 1, wherein said manufacturing processes of the semiconductor integrated circuit are channel ion implantation processes for transistors in which various kinds of gate voltage are selected.

13. A computer program product for a method of automatically correcting mask pattern data, wherein said mask pattern data is for producing a plurality of photo masks used in manufacturing processes of a semiconductor integrated circuit where cells including dummy cells are placed on a semiconductor chip, the computer program product embodied on a computer-readable medium and comprising code that, when executed, causes a computer to perform the following:
(a) merging tentatively an assistant mask layer into one of a plurality of main mask layers, wherein each of said plurality of main mask layers corresponds to one of said plurality of photo masks, said assistant mask layer includes a plurality of first regions, each of which corresponds to one of said dummy cells;
(b) checking whether or not said one of the plurality of main mask layers and said merged assistant mask layer agree with a design rule;
(c) replacing said one of the plurality of main mask layers with another one of said plurality of main mask layers, into which said assistant mask layer is merged, when a violation against said design rule is found in said step (b); and
(d) converting said assistant mask layer into said merged one of said plurality of main mask layers, wherein said merged one of the plurality of main mask layers does not have a violation against said design rule.

14. The computer program product according to claim 13, further comprising:
(e) repeating said steps (a) to (c) before said step (d) until a violation against said design rule is not found.

15. The computer program product according to claim 13, further comprising:
(f) providing said assistant mask layer such that said plurality of first regions can be merged into at least one of said plurality of main mask layers.

16. The computer program product according to claim 13, wherein said step (a) includes:
(a1) merging tentatively said assistant mask layer into said one of the plurality of main mask layers such that each of said plurality of first regions is merged into adjacent one of a plurality of second regions which included in said one of the plurality of main mask layers.

17. The computer program product according to claim 16, wherein said step (a1) includes:
(a11) selecting said adjacent one of the plurality of second regions from said plurality of second regions by a predetermined priority, and
(a12) merging tentatively said each of the plurality of first regions into said selected adjacent one of the plurality of second regions.

18. The computer program product according to claim 13, wherein said step (d) includes:
- (d1) converting said assistant mask layer into said merged one of said plurality of main mask layers such that each of said plurality of first regions is converted into adjacent one of a plurality of second regions which included in said merged one of the plurality of main mask layers.

19. The computer program product according to claim 18, wherein said step (d1) includes:
- (d11) selecting said adjacent one of the plurality of second regions from said plurality of second regions by a predetermined priority, and
- (d12) converting said each of the plurality of first regions into said selected adjacent one of the plurality of second regions.

20. The computer program product according to claim 19, wherein said step (d12) includes:
- (d121) converting said each of the plurality of first regions into said selected adjacent gone of the plurality of second regions such that one of said plurality of second regions is not surrounded and isolated by another plurality of second regions which is included in another of plurality of main mask layers.

21. The computer program product according to claim 13, further comprising:
- (g) providing said assistant mask layer such that dimensions and placing positions of said plurality of first regions are predetermined to agrees with said design rule when said assistant mask layer is combined with one of said plurality of main mask layers.

22. The computer program product according to claim 21, wherein said step (g) includes:
- (g1) providing said assistant mask layer such that dimensions and placing positions of regions except for said plurality of first regions are predetermined to agrees with said design rule when said assistant mask layer is combined with one of said plurality of main mask layers.

23. The computer program product according to claim 13, wherein said step (a) includes:
- (a2) selecting said one of the plurality of main mask layers from said plurality of main mask layers by a predetermined priority.

24. The computer program product according to claim 13, wherein said manufacturing processes of the semiconductor integrated circuit are channel ion implantation processes for transistors in which various kinds of gate voltage are selected.

* * * * *